US006903271B2

(12) United States Patent
Pearson et al.

(10) Patent No.: US 6,903,271 B2
(45) Date of Patent: Jun. 7, 2005

(54) ELECTRONIC ASSEMBLY WITH THERMALLY SEPARATED SUPPORT

(75) Inventors: Tom E. Pearson, Beaverton, OR (US); Terry Dishongh, Portland, OR (US); Damion Searls, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/676,546

(22) Filed: Sep. 30, 2003

(65) Prior Publication Data

US 2005/0067178 A1 Mar. 31, 2005

(51) Int. Cl.[7] .............................................. H01L 23/02
(52) U.S. Cl. ...................... 174/52.4; 361/719; 257/713
(58) Field of Search ........................ 174/52.2, 52.4; 257/712, 713; 361/719

(56) References Cited

U.S. PATENT DOCUMENTS

| | | | | |
|---|---|---|---|---|
| 5,883,782 A | * | 3/1999 | Thurston et al. | ............ 361/704 |
| 5,901,039 A | * | 5/1999 | Dehaine et al. | ............. 361/704 |
| 5,926,371 A | * | 7/1999 | Dolbear | ...................... 361/704 |
| 5,978,223 A | * | 11/1999 | Hamilton et al. | ........... 361/704 |
| 6,333,460 B1 | * | 12/2001 | Toy et al. | ................... 174/52.4 |
| 6,392,888 B1 | * | 5/2002 | Chen et al. | ................. 361/704 |
| 6,462,271 B2 | * | 10/2002 | Coffin et al. | ............... 174/52.1 |
| 6,570,764 B2 | * | 5/2003 | Bhatia et al. | ............... 361/705 |
| 6,631,078 B2 | * | 10/2003 | Alcoe et al. | ................ 361/719 |
| 6,724,629 B1 | * | 4/2004 | Augustin et al. | ........... 361/704 |
| 6,831,834 B1 | * | 12/2004 | Salmonson | ................. 361/704 |
| 6,836,408 B2 | * | 12/2004 | Gektin et al. | ............... 361/704 |

* cited by examiner

*Primary Examiner*—Hung V. Ngo
(74) *Attorney, Agent, or Firm*—Blakely, Sokoloff, Taylor & Zafman LLP

(57) ABSTRACT

According to one aspect of the invention, an electronic assembly and a method for constructing an electronic assembly are provided. Insulating bodies interconnect a heat sink plate, or support plate, and a plurality of support members to form a heat sink assembly. The heat sink assembly is placed on a circuit board along with a semiconductor package. The entire circuit board is heated to solder the heat sink assembly and the semiconductor package to the circuit board. The insulating bodies thermally separate the heat sink plate and the support members so that heat is not conducted from the support members to the heat sink plate, and the heat sink plate and semiconductor package may be attached to the circuit board in a one-step heating process.

23 Claims, 6 Drawing Sheets

ELECTRONIC ASSEMBLY WITH THERMALLY SEPARATED SUPPORT

BACKGROUND OF THE INVENTION

1). Field of the Invention

This invention relates to an electronic assembly and a method of constructing an electronic assembly.

2). Discussion of Related Art

Integrated circuits are formed on semiconductor wafers, which are then sawed into individual semiconductor chips, also known as microelectronic dies. Each resulting die is then packaged on a package substrate. The package substrate has a number of Ball Grid Array (BGA) solder ball contact formations on an opposing side, which are electronically connected to the integrated circuit through the package substrate. The package is then placed on a circuit board so that the solder balls may be heated to reflow to attach the package to the circuit board.

A heat sink, or a heat spreader, is often attached to the circuit board and thermally connected to the microelectronic die. The heat sink may remove heat from the microelectronic die as well as structurally reinforce the circuit board. The heat sink is attached to the circuit board by metal pins, or heat sink leads, which are soldered to the circuit board.

Because of the heat sinking properties of the heat sink and pins, the solder cannot be melted at the same temperature the solder balls are reflown as heat conducts from the pins into the heat sink. Therefore, the heat sink cannot be attached to the circuit board in the solder reflow oven, which is used to attach the package substrate to the circuit board.

BRIEF DESCRIPTION OF THE DRAWINGS

The invention is described by way of examples with reference to the accompanying drawings, wherein.

DETAILED DESCRIPTION OF THE INVENTION

FIG. 1 to FIG. 8c illustrate an electronic assembly and a method for constructing an electronic assembly. Insulating bodies interconnect a heat sink plate, or support plate, and a plurality of support members to form a heat sink assembly. The heat sink assembly is placed on a circuit board along with a semiconductor package. The entire circuit board is heated to solder the heat sink assembly and the semiconductor package to the circuit board. The insulating bodies thermally separate the heat sink plate and the support members so that heat is not conducted from the support members to the heat sink plate, and the heat sink plate and semiconductor package may be attached to the circuit board in a one-step heating process.

Figure 1:
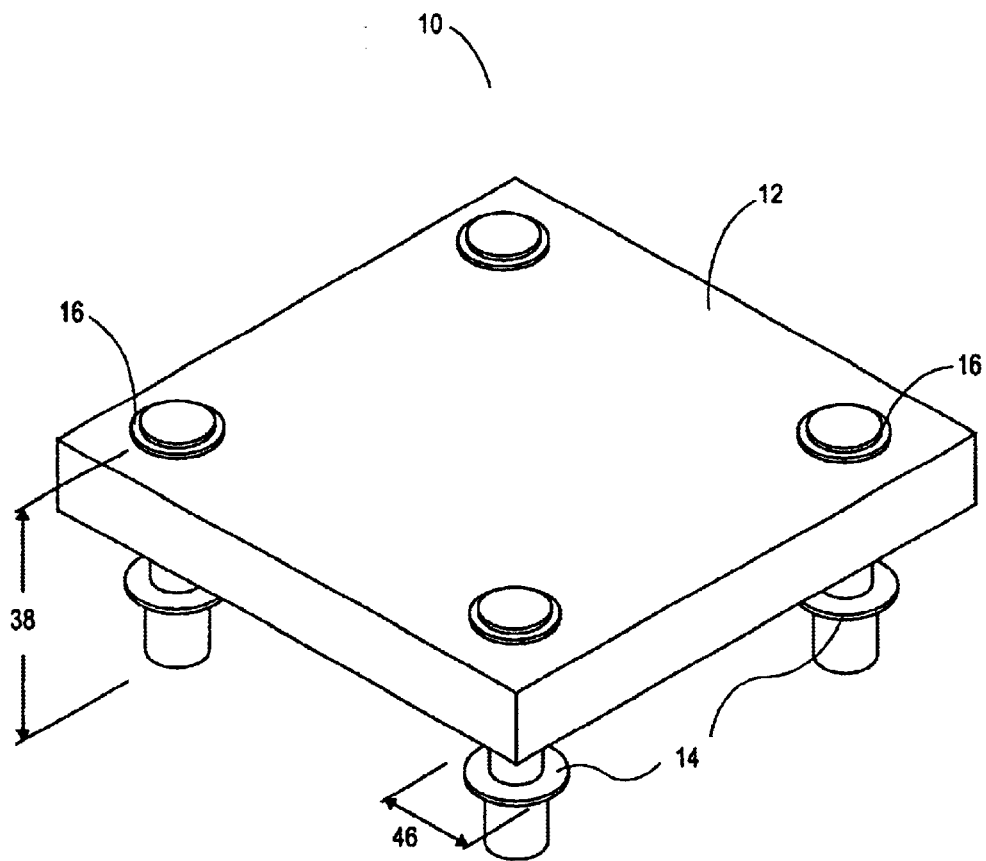
FIG. 1 is a perspective view of a heat sink assembly including a plate and heat sink pins.
Figure 2:
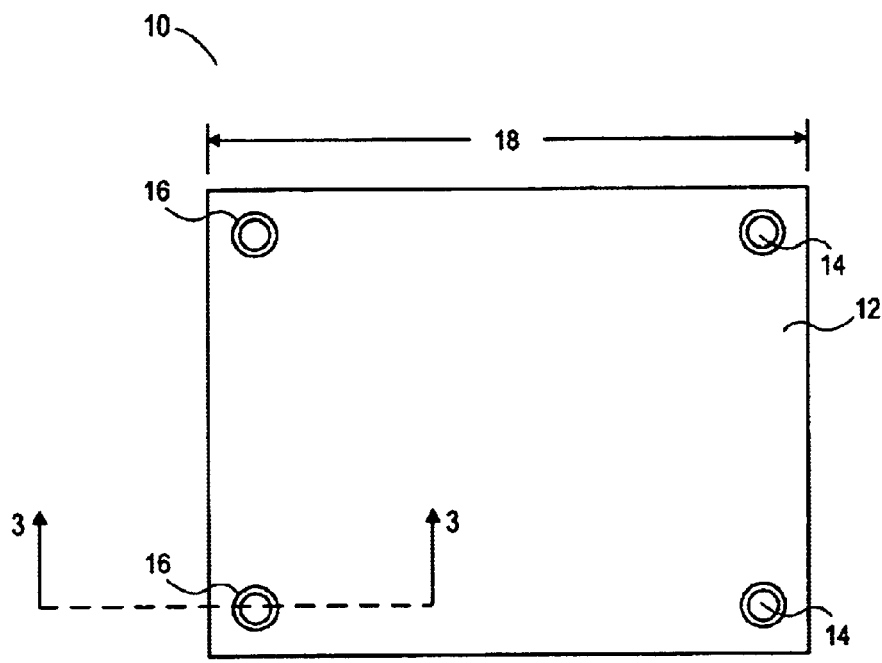
FIG. 2 is a top plan view of the heat sink assembly of FIG. 1.
Figure 3:
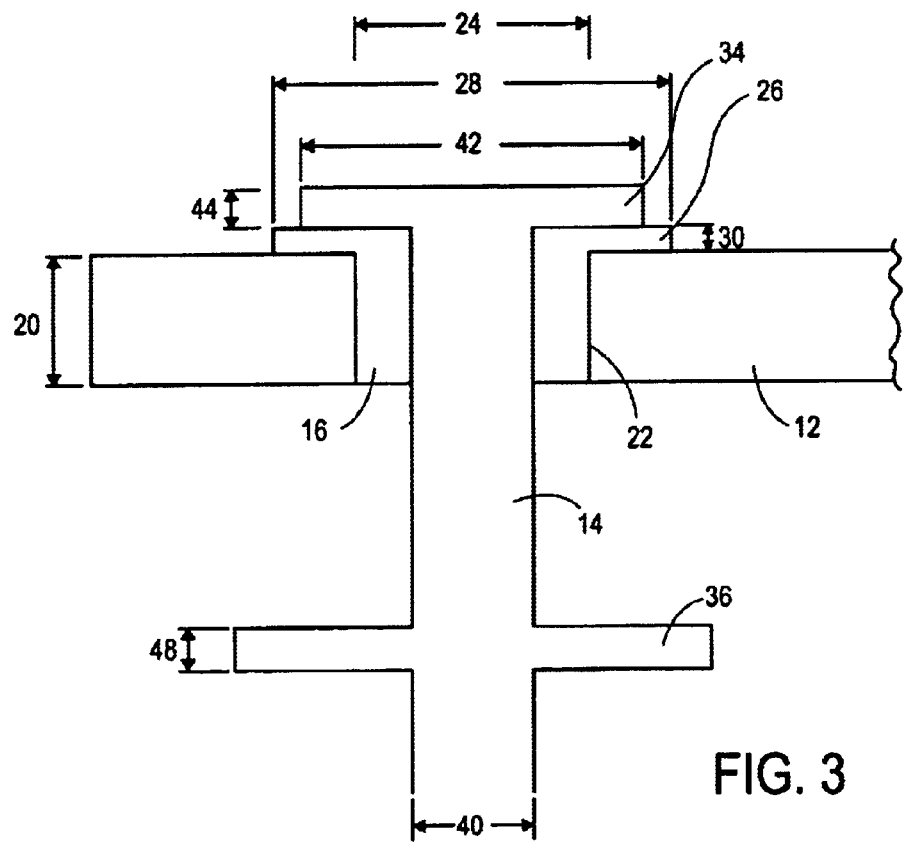
FIG. 3 is a cross-sectional side view on 3—3 in FIG. 2 of one of the pins and a portion of the plate.

FIGS. 1–3 illustrate a heat sink assembly 10. The heat sink assembly 10 includes a plate 12, a plurality of pins 14, and a plurality of insulating bushings 16.

In an embodiment, the plate 12 may be made of a thermally conductive material such as copper, aluminum, gold, or titanium. The plate 12 may be square with a side length 18 of between 20 and 70 mm and a thickness 20 of between 1 and 8 mm. Holes 22 may lie at each corner of the plate 12, which extend through the entire thickness 20 thereof. The holes 22 may be circular with diameters 24 of, for example, between 2 and 10 mm.

In an embodiment, the insulating bushings, or insulating bodies, 16 may be annular, ring-shaped bodies made of a thermally insulating material such as a liquid crystal polymer. One bushing 16 may fit in each of the holes 22. A top portion 26 of the insulated bushings 16 may be adjacent to a top surface of the plate 12 and extends outwards from the holes 22. The top portion 26 may be circular with, for example, a diameter 28 of between 3 and 12 mm and a thickness 30 of between 1 and 3 mm.

In an embodiment, each pin 14, or support member, may be made of a rigid, thermally conductive material such as copper, aluminum, titanium, or gold and may be plated with tin lead, or another solder material. The pins 14 may have a pin shaft 32, a top piece 34, and a collar 36. The pin shaft 32 may be cylindrical with, for example, a height 38 of between 5 and 15 mm and a diameter 40 of between 1 and 5 mm. The top piece 34 may be a circular disk attached to an upper end of the pin shaft 32. The top piece 34 may have a diameter 42 of between 2 and 10 mm and a thickness 44 of between 0.25 and 3 mm. The collar 36 may be a circular disk attached to a mid-portion of the pin shaft 32. The collar 36 may have, for example, a diameter 46 of between 3 and 12 mm and a thickness 48 of between 1 and 3 mm.

As shown in FIG. 3, the pin shaft 32 may be inserted through the insulating bushing 16, which is in the hole 22. The top piece 34 of the pin 14 may be adjacent to the top portion 26 of the insulating bushing 16. The insulating bushing 16 may completely separate the pin 14 from the plate 12 so that no portion of the plate 12 is in contact with any portion of the pin 14 to thermally separate the pin 14 from the plate 12.

Figure 4A:
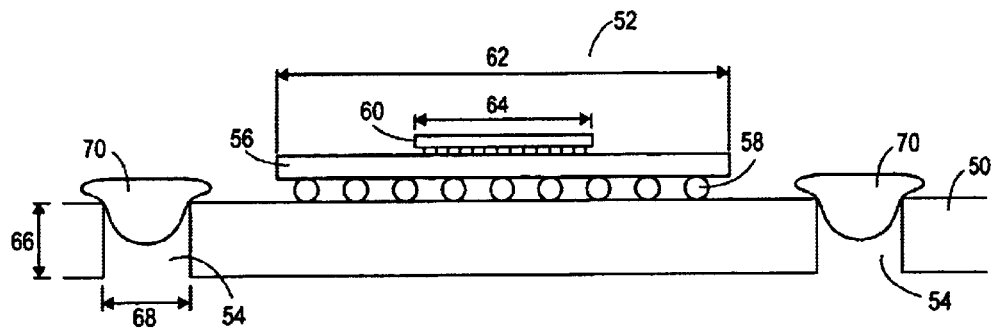
FIGS. 4a–4c are cross-sectional side views of a circuit board, having a semiconductor package placed thereon, illustrating a process for attaching the heat sink assembly of FIG. 1 thereto.
Figure 4B:
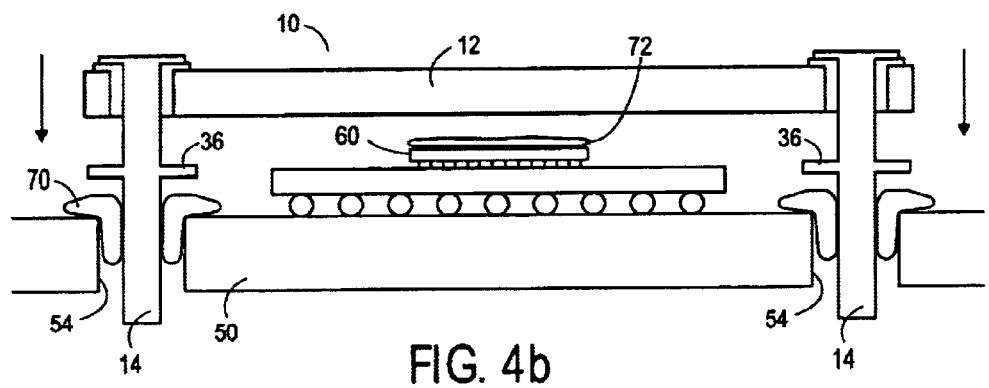
Figure 4C:
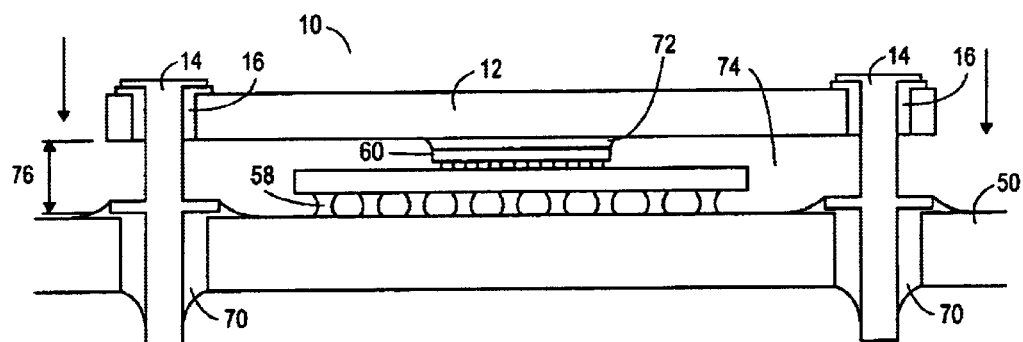

FIGS. 4a–4c illustrate a process for attaching the heat sink assembly 10 to a circuit board 50. In an embodiment, the circuit board 50 may have a semiconductor package 52 placed thereon and a plurality of pin holes 54 therethrough. The semiconductor package 52 may include a package substrate 56, a set of contact formations 58 on a bottom surface thereof, and a microelectronic die 60 mounted to a top surface thereof. The contact formations may be in the form of a BGA (Ball Grid Array) of solder balls, but other electrical contacts may be used such as electric posts, wire bonding, gull wing leads, J-leads, and other typical package to circuit board interface leads.

Although not shown, both the package substrate 56 and the microelectronic die 60 may be square. The package substrate 56 may, for example, have a width 62 of between 10 and 30 mm, a thickness of between 0.5 and 3 mm, and a plurality of alternating conducting and insulating layers therein, as is commonly understood in the art. The microelectronic die 60 may have a width 64 of between 3 and 15 mm and a thickness of between 0.3 and 1 mm and include an integrated circuit, with multiple transistors and capacitors, formed therein as is commonly understood in the art. Although not shown, it should be understood that a plurality of small contact formations, such as solder balls, may interconnect the microelectroric die 60 and the package substrate 56.

In an embodiment, the circuit board 50 may have, for example, a thickness 66 of between 1 and 5 mm and the pin holes 54 may have diameters 68 of between 3 and 10 nun. As shown in FIGS. 4a–4c, the semiconductor package 52 may be placed on the circuit board 50 between the pin holes 54. Although not shown, it should be understood that the circuit board 50 may include a plurality of contact pads at a surface thereof, and each contact pad may be located directly beneath a respective contact formation 58 of the BGA on the package substrate 56. The contact formations 58 in FIG. 4a are not secured to the contact pads of the circuit board 50.

As shown in FIG. 4a, masses 70 of solder may be deposited over the pin holes 54. The amount of solder in each mass 70 may be sufficient to completely cover an upper opening of each of the pin holes 54 and partially extend through the pin holes 54 to an opposing side of the circuit board 50.

Next, as illustrated in FIG. 4b, a thermally conductive interface material 72 may be deposited on top of the microelectronic die 60. Then the heat sink assembly 10 may be placed on the circuit board 50. The heat sink assembly 10 may be lowered so that the pins 14 penetrate the masses 70 of solder and extend completely through the pin holes 54, the collars 36 of the pins 14 rest on top of the masses of solder 70, and the plate 12 rests on top of the thermal interface material 72. The entire assembly may then be heated to a temperature, such as 183° C., depending on the materials used, sufficient to melt or reflow the BGA contact formations 58 and the masses 70 of solder while a force presses the heat sink assembly 10 toward the circuit board 50 as shown in FIG. 4c. Because of the low thermal conductivity of the insulating bushings 16, the plate 12 is thermally separated from the pins 14. Therefore, when the assembly is heated to reflow the contact formations 58 and melt the masses 70 of solder, heat is not conducted from the pins 14 to the plate 12 allowing the masses 70 of solder to reach a temperature sufficient to melt.

After the assembly is allowed to cool, the contact formations 58 and the masses 70 of solder secure the semiconductor package 52 and the heat sink assembly 10 to the printed circuit board 50. Thus the semiconductor package 52 and the heat sink assembly 10 may be attached to the circuit board 50 at approximately the same time in a single-step heating process.

After the heat sink assembly 10 is attached to the circuit board 50, an airspace 74 may remain between the plate 12 and the circuit board 50. The airspace 74 may have a height 76 of, for example, between 0.1 and 5 mm. The collars 36 of the pins 14 may now lie on the upper surface of the circuit board 50, which holds the pins 14 in place. The top pieces 34 of the pins may prevent the plate 12 from moving away from the circuit board 50 and the semiconductor package 52. The plate 12 may rest on top of the microelectronic die so that the plate 12 cannot move any further towards the circuit board 50. The thermal interface material 72 may now interconnect the microelectronic die 60 and the plate 12.

In use, the circuit board 50, with the heat sink assembly 10 attached thereto, may be installed into an electronic device such as a computer. Power may be supplied to the integrated circuit within the microelectronic die 60 through the circuit board 50, the contact pads on the circuit board 50, and the package substrate 56. As the integrated circuit operates, heat may be generated within the die 60. The heat may conduct from the die 60 through the thermal interface material 72 and into the plate 12. The heat may then convect into the air surrounding the heat sink assembly 10. This convection may occur constantly during operation of the integrated circuit to cool the microelectronic die 60.

If the circuit board 50 undergoes any additional stress, such as warping during heating due to different coefficients of expansion of different materials or vibration from mishandling, the heat sink assembly 10 may act as a stiffening board to add structural support to the circuit board 50. As shown in FIG. 4c the plate 12 may be held between the top pieces 34 of the pins 14 and the semiconductor package 52. Furthermore, the collars 36 of the pins 14 and the reflown solder masses 70 may secure the heat sink assembly 10 to the circuit board 50.

One advantage is that because of the insulation between the pins 14 and the plate 12 provided by the insulating bushings 16, a single-step heating process may be used to attach both the semiconductor package 52 and the heat sink assembly 10 to the circuit board 50. Another advantage is that the circuit board 50 is stiffened and structurally supported by the heat sink assembly 10 thereby reducing warping of the circuit board 50 and reducing the stress on the BGA contact formations 58. Therefore, the reliability and durability of the connections between the package substrate 56 and the circuit board 50 are improved. A further advantage is that heat is removed from the microelectronic die thereby increasing the reliability of the integrated circuit therein.

Figure 5:
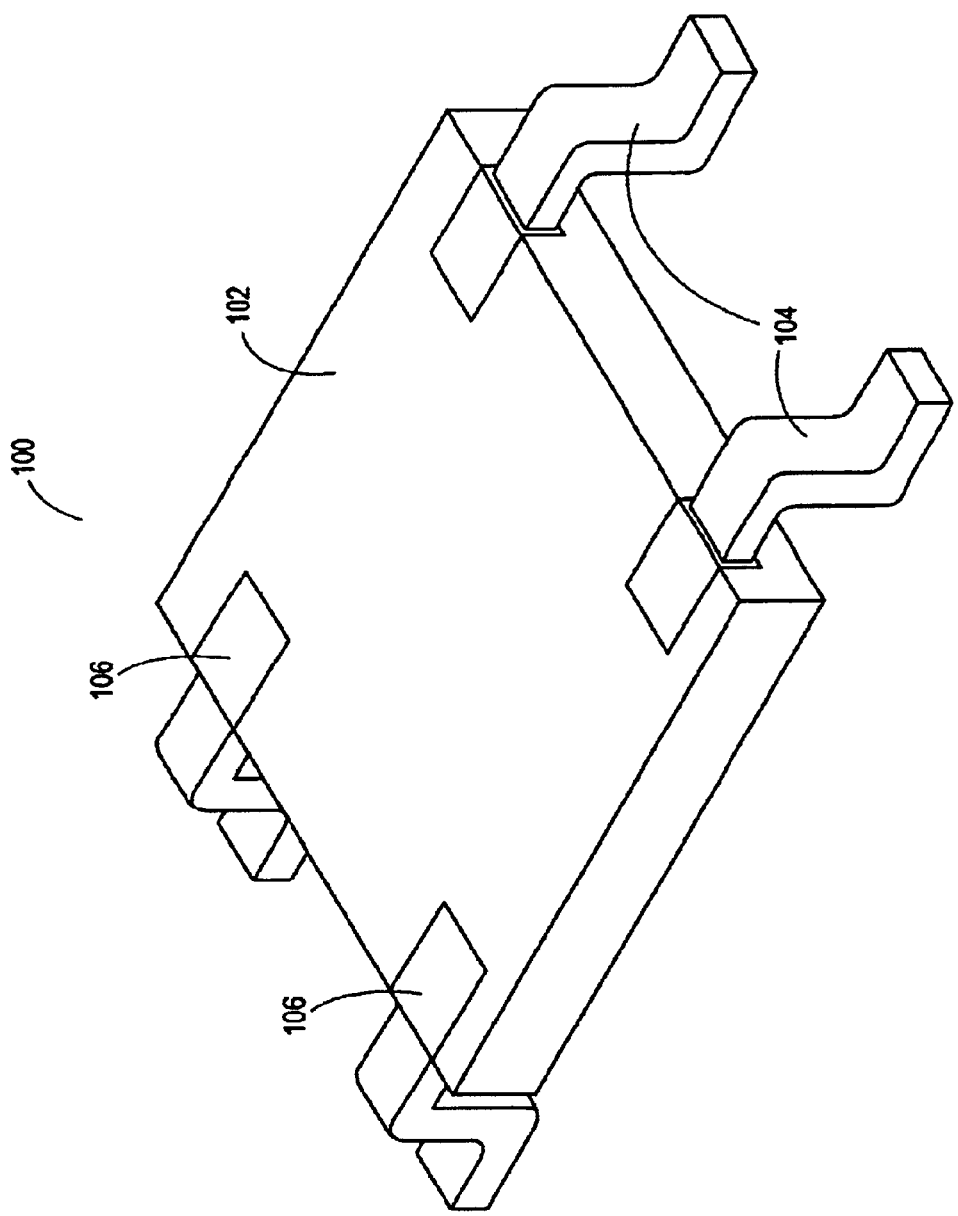
FIG. 5 is a perspective view of a heat sink assembly, according to another embodiment of the invention, including a plate and heat sink leads.
Figure 6:
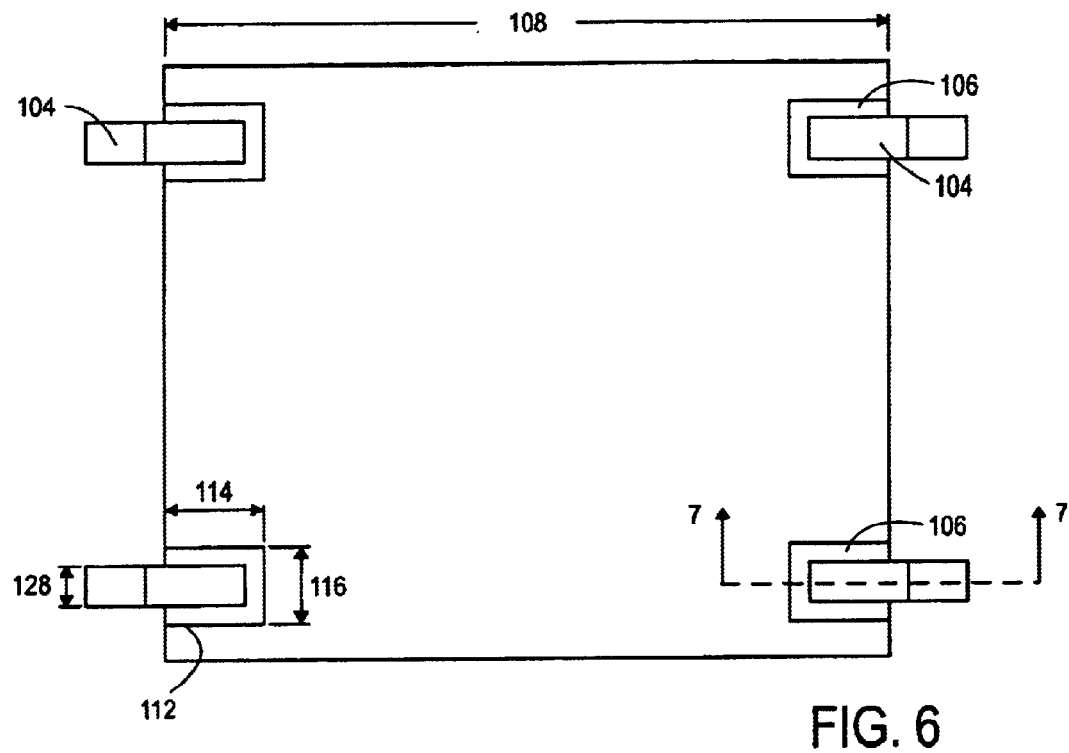
FIG. 6 is a top plan view of the heat sink assembly of FIG. 5.
Figure 7:
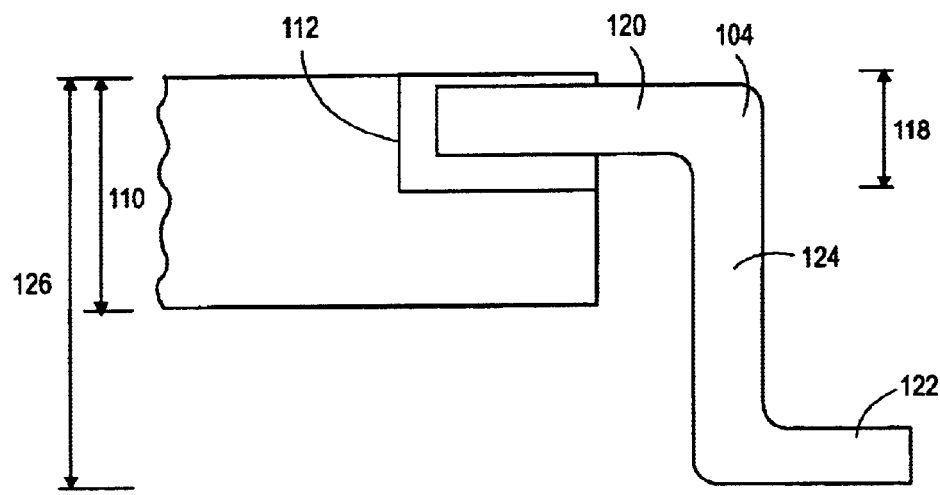
FIG. 7 is a cross-sectional side view on 7—7 in FIG. 6 of one of the heat sink leads and a portion of the plate.

FIGS. 5–7 illustrate a heat sink assembly 100 according to another embodiment of the invention. The heat sink assembly 100 may include a plate 102, heat sink leads 104, and insulating bodies 106.

In an embodiment, the plate 102 may be made of copper and be square with a side length 108 of between 20 and 70 mm and a thickness 110 of between 1 and 8 mm. Four recesses 112 may lie at outer portions of two opposing sides of an upper surface of the plate 102. Each recess 112 may, for example, have a length 114 of approximately 6 mm as measured from an outer edge of the plate 102, a width 116 of 4 mm, and a depth 118 of 3 mm as measured from an upper surface of the plate 102. Each recess 112 may be rectangular in shape.

Each insulating body 106 may be made of a material with a low thermal conductivity and may lie within one of the recesses 112. The insulating bodies 106 may be rectangular and have dimensions, which are the same as the recess 112. In an embodiment, the insulating bodies 106 are made of low temperature co-fired ceramic material.

The heat sink leads may be made of copper and have plate portions 120, circuit board portions 122, and vertical portions 124.

An end of the plate portion 120 of each heat sink lead 104 may be embedded within an insulating body 106. To embed the plate portion 120 within the insulating body 106, the plate portion 120 may be positioned within the recess 112 so that the plate portion 120 is not in contact with any portion of the plate 102. A low temperature co-fired ceramic powder may then be deposited within the recess 112 and completely surround the plate portion 120 of the heat sink lead 104. The heat sink assembly 100 may then be heated causing the powder to melt. After cooling, the low temperature co-fired ceramic material may surround the end of the plate portion 120 within the recess 112.

In an embodiment, the heat sink leads 104 may extend horizontally from the insulating bodies 106, away from the outer edge of the plate 102. The vertical portions 124 of the heat sink leads 104 may extend downwards from the plate portions and have heights 126 of, for example, 2 cm. The circuit board portion 122 of each heat sink lead 104 may be connected to a lower end of the vertical portion 124 and extend horizontally away from the plate 102. When viewed from the top, the heat sink leads 104 may have a width 128 of, for example, 2 mm.

The insulating bodies 106 may interconnect the heat sink leads 104 and the plate 102 so that no portions of the heat sink leads 104 contact the plate 102.

Figure 8A:
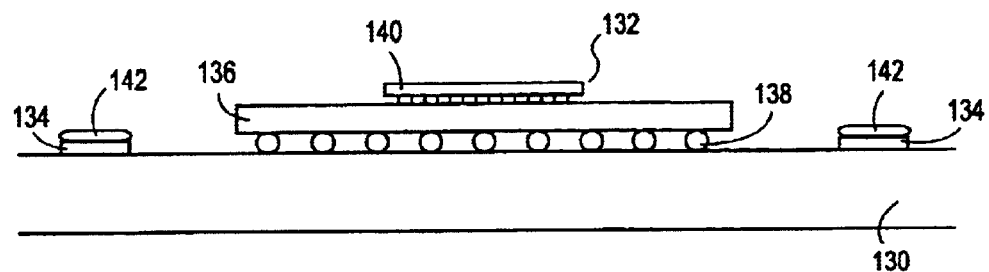
FIGS. 8a–8c are cross-sectional side views of a circuit board, having a semiconductor package placed thereon, illustrating a process for attaching the heat sink assembly of FIG. 5 thereto.
Figure 8B:
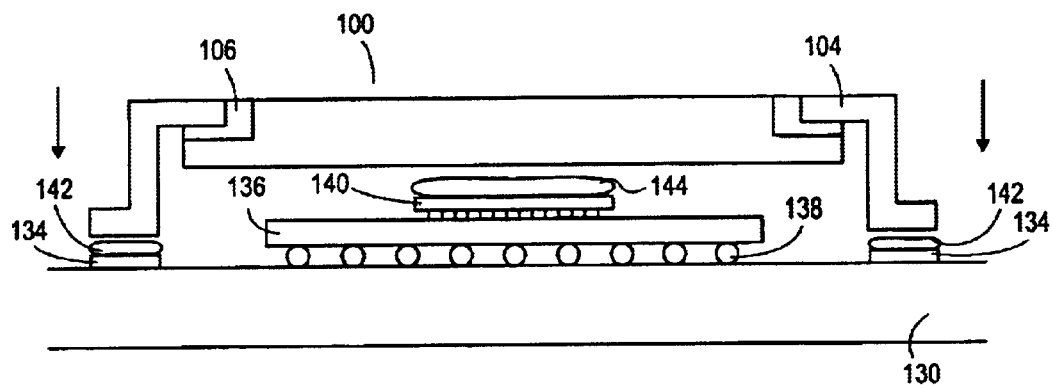
Figure 8C:
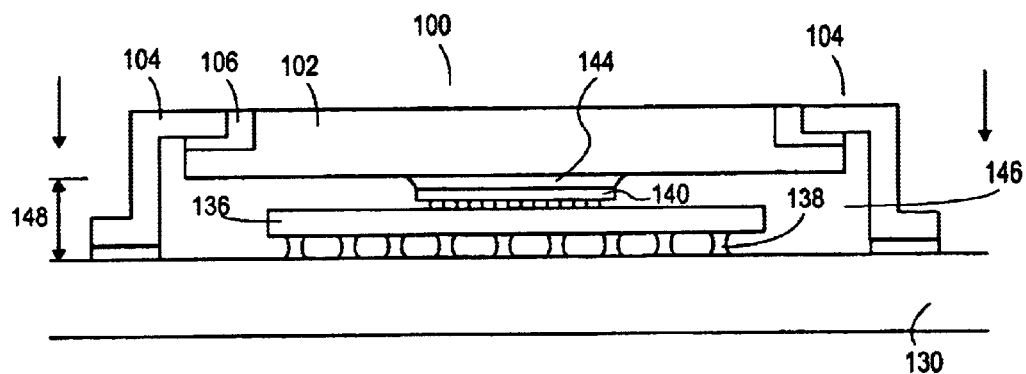

FIGS. 8a–8c illustrate a process for attaching the heat sink assembly 100 to a circuit board 130. The circuit board 130 may include a semiconductor package 132 placed thereon and solder pads 134. The semiconductor package 132 is similar to the semiconductor package 52 shown in FIGS. 4a–4c and may include a package substrate 136, a plurality of contact formations 138 on a bottom surface of the package substrate 136, and a microelectronic die 140 mounted on a top surface of the package substrate 136. The semiconductor package 132 may be placed on the circuit board 130 and lie between the solder pads 134. Masses 142 of solder paste may then be deposited onto the solder pads 134.

As shown in FIG. 8b, a thermally conductive interface material 144 may then be deposited on an upper surface of the microelectronic die 140. The heat sink assembly 100 may then be placed on the circuit board 130 so that the circuit board portions 122 of the heat sink leads 104 lie on top of the masses 142 of solder paste and the plate 102 lies on top of the thermal interface material 144.

The entire assembly may then be heated while a force, as shown in FIG. 8c, is applied on the heat sink assembly 100 towards the circuit board 130. The entire circuit board 130 may be heated to a temperature sufficient to melt the solder 142 and reflow the contact formations 138, such as 183° C. Because of the insulating properties of the insulating bodies 106, heat is not conducted from the heat sink leads 104 into the plate 102. Therefore a one-step heating process may be used to both melt the solder 142 and reflow the contact formations 138. Thus, both the heat sink assembly 100 and the semiconductor package 132 may be secured to the circuit board 130 at approximately the same time using the same heating process. As shown in FIG. 8c, as the solder melts the heat sink assembly 100 moves closer to the circuit board 130 so that the circuit board portions 122 of the heat sink leads 104 may substantially contact the solder pads 134 on the circuit board 130. After the heating process has taken place, the thermal interface material 144 may interconnect the microelectronic die 140 and the plate 102. An airspace 146 may remain between the plate 102 and the circuit board 130. The airspace 146 may have a height 148 of approximately 2.5 cm.

In use, as with the heat sink assembly 10 shown in FIG. 1, the circuit board 130 may be installed into an electronic device such as a computer. Power may be delivered to the microelectronic die 140 through a circuit board 130 and a package substrate 136. As the integrated circuit within the microelectronic die 140 operates, heat may be generated within the microelectronic die 140. The heat may conduct from the microelectronic die 140 through the thermal interface material 144 and into the plate 102. The heat may then be convected into the surrounding air. This process may be continually repeated thus removing heat from the microelectronic die.

Furthermore, the heat sink assembly 100 adds structural support to the circuit board 130.

One advantage is that both the semiconductor package 132 and the heat sink assembly 100 may be attached to the circuit board at approximately the same time in a single-step heating process. Another advantage is that the heat sink assembly 100 stiffens and adds structural support to the circuit board 130 thereby minimizing warping due to uneven heating and increasing the reliability of the contacts between the semiconductor package 132 and the circuit board 130.

Other embodiments may not be placed directly over a semiconductor package or may be placed on a circuit board which does not have a semiconductor package at all. The heat sink assembly may be used as a circuit board support to stiffen a circuit board, or other substrate, without taking advantage of the thermal management properties thereof. The plate and support members may be made of other materials such as aluminum, gold, and titanium. The insulating bodies and the insulating bushings may be made of different non-thermally conductive materials, such as fiberglass and other polymers and ceramics, as long as a sufficient thermal separation exists between the support members of the heat sink and the heat sink plate so that a single-step heating process may be used to attach both the heat sink and the semiconductor package to the circuit board. The heat sink may include a plurality of fins, or other such structures, to increase the convection of heat into the surrounding air.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. An electronic assembly comprising:
   a substrate;
   a support plate; and
   a plurality of support members, each having a first portion attached to the substrate and second portion attached to the thermally conductive body, the support member being thermally separated from the support plate.

2. The electronic assembly of claim 1, further comprising an insulating body interconnecting the support plate and the support members.

3. The electronic assembly of claim 2, wherein the insulating body is formed on the support plate.

4. The electronic assembly of claim 3, wherein the insulating body is in a recess on the support plate.

5. The electronic assembly of claim 4, wherein the second portion of the support member is embedded in the insulating body.

6. The electronic assembly of claim 5, wherein the insulating body is at least one of a ceramic and a liquid crystal polymer.

7. The electronic assembly of claim 6, wherein the substrate is a circuit board.

8. The electronic assembly of claim 7, wherein the support plate is metal.

9. The electronic assembly of claim 8, wherein the support plate is a heat sink.

10. The electronic assembly of claim 9, further comprising a package substrate attached to the circuit board and a microelectronic die mounted on the package substrate, the heat sink being thermally connected to the microelectronic die.

11. The electronic assembly of claim 10, wherein the heat sink is on a side of the package substrate opposing the circuit board.

12. The electronic assembly of claim 11, wherein the package substrate includes a plurality of contact formations on a bottom surface thereof, the contact formations interconnecting the package substrate and the circuit board.

13. The electronic assembly of claim 12, wherein the microelectronic die is a microprocessor.

14. The electronic assembly of claim 13, further comprising a thermal interface material interconnecting the microelectronic die and the heat sink.

15. An electronic assembly comprising:
a circuit board;
a package substrate attached to the circuit board;
a microelectronic die mounted to the package substrate;
a thermally conductive plate thermally connected to the microelectronic die;
a plurality of insulating bodies attached to the thermally conductive plate; and
a plurality of support members having first and second portions, the first portions attached to the circuit board, the second portions attached to the insulating bodies.

16. The electronic assembly of claim 15, further comprising solder between the circuit board and the package substrate and between the circuit board and the support members and wherein the support members are thermally separated from the conductive plate such that when the circuit board is heated to a temperature to reflow the solder between the circuit board and the package substrate, a sufficient amount of heat remains in the support members to reflow the solder between the support members and the circuit board.

17. The electronic assembly of claim 16, wherein the support members are metal pins.

18. The electronic assembly of claim 17, wherein the metal pins are soldered to the circuit board.

19. The electronic assembly of claim 18, wherein the circuit board is a motherboard.

20. The electronic assembly of claim 19, wherein the microelectronic die is a microprocessor.

21. The electronic assembly of claim 20, wherein the thermally conductive plate is a heat sink.

22. The electronic assembly of claim 21, further comprising a over the package substrate.

23. The electronic assembly of claim 22, further comprising a thermal interface material interconnecting the heat sink and the microelectronic die.

* * * * *

UNITED STATES PATENT AND TRADEMARK OFFICE
CERTIFICATE OF CORRECTION

PATENT NO. : 6,903,271 B2
DATED : June 7, 2005
INVENTOR(S) : Pearson

It is certified that error appears in the above-identified patent and that said Letters Patent is hereby corrected as shown below:

<u>Column 8,</u>
Lines 23-24, delete "further comprising a" and insert -- wherein the heat sink is --.

Signed and Sealed this

Sixteenth Day of August, 2005

JON W. DUDAS
*Director of the United States Patent and Trademark Office*